United States Patent [19]

Becker et al.

[11] Patent Number: 5,273,939
[45] Date of Patent: Dec. 28, 1993

[54] METHOD OF ASSEMBLING MICROMECHANICAL SENSORS

[75] Inventors: Rolf Becker; Klaus Jaeckel; Jiri Marek, all of Reutlingen; Frank Bantien, Ditzingen; Helmut Baumann, Gomaringen; Kurt Weiblen, Metzingen; Martin Willmann, Reutlingen, all of Fed. Rep. of Germany

[73] Assignee: Robert Bosch GmbH, Stuttgart, Fed. Rep. of Germany

[21] Appl. No.: 828,106

[22] Filed: Jan. 30, 1992

[30] Foreign Application Priority Data

Mar. 9, 1991 [DE] Fed. Rep. of Germany ....... 4107658

[51] Int. Cl.$^5$ ............................................. H10L 21/60
[52] U.S. Cl. ........................................ 437/209; 437/64; 437/65; 437/133; 437/195
[58] Field of Search ................ 437/209, 133, 195, 64, 437/65; 156/656, 657

[56] References Cited

U.S. PATENT DOCUMENTS

| | | |
|---|---|---|
| 4,257,274 | 3/1981 | Shimada . |
| 4,326,188 | 4/1982 | Dahlberg . |
| 4,398,342 | 8/1983 | Pitt et al. ............................ 437/133 |
| 4,620,365 | 11/1986 | Burger et al. ....................... 156/656 |
| 4,670,092 | 6/1987 | Motamedi ............................ 437/65 |
| 4,881,410 | 11/1989 | Wise . |
| 5,071,510 | 12/1991 | Findler et al. ...................... 437/230 |

FOREIGN PATENT DOCUMENTS 2081973 2/1982 United Kingdom .

OTHER PUBLICATIONS

Anton Heuberger, *Micromechanik*, 1989, pp. 470–477, published by Springer Verlag, Berlin-Heidelberg-NY-Paris-Tokyo.

*Primary Examiner*—Brian E. Hearn
*Assistant Examiner*—Kevin M. Picardat
*Attorney, Agent, or Firm*—Frishauf, Holtz, Goodman & Woodward

[57] ABSTRACT

A method is proposed for assembling micromechanical sensors, in particular Hall sensors, or pressure or acceleration sensors, in which at least one silicon sensor element is applied to a substrate. The at least one silicon sensor element is joined to the substrate via at least one assembly pedestal, the cap faces of which are kept small compared with the surface of the silicon sensor element, so that a gap exists between the substrate and the silicon sensor element except for the region of the at least one assembly pedestal.

11 Claims, 7 Drawing Sheets

METHOD OF ASSEMBLING MICROMECHANICAL SENSORS

Cross-reference to related patents and pending applications, the disclosures of which are incorporated by reference U.S. Pat. No. 4,398,342, PITT et al./Int. Standard Electric Corp., METHOD OF MAKING A HALL EFFECT SENSOR;

U.S. Pat. Nos. 4,522,067 and 4,620,365, BURGER.

U.S. Pat. No. 5,005,414, HOLLAND et al. (=DE-OS 38 14 950)

U.S. Pat. No. 4,955,234, MAREK, issued Sept. 11, 1990=DE 38 14 952

U.S. Pat. No. 5,071,510 FINDLER & NUENZEL, issued Dec. 10, 1991, corresponding to German P 39 31 590.9 of 22 Sep. 1989 and German application P 40 02 472.0 of 6 Feb. 1990, U.S. Ser. No. 07/631,623, MAREK, BANTIEN, HAACK & WARTH, corresponding to German Patent DE-PS 40 00 903 of 9 Aug. 1990, now U.S. Pat. No. 5,151,763

U.S. Ser. No 07/893,904, MAREK, filed Jun. 17, 1991, corresponding to German P 40 22 464.3, filed Jul. 14, 1990.

German Patent Disclosure DE 36 09 841, filed Mar. 22, 1986, and Published International Application WO 87-05569, HEINTZ et al;

ENGELSDORF & METTNER, German Patent Disclosure DE-OS 39 19 876, publ. Dec. 20, 1990, and corresponding PCT/DE90/00366, publ. Dec. 27, 1990 as WO 90-15933;

U.S. Ser. No. 07/566,997, METTNER et al., filed Aug. 13, 1990, and corresponding PCT/EP90/01297, publ. as WO 91-02169;

German Patent Disclosure DE 40 16 471.3 and corresponding U.S. Ser. No. 07/701,781, BANTIEN, filed May 17, 1991; now U.S. Pat. No. 5,148,604

German Patent Application P 40 22 495.3, filed July 1990;

German Patent Disclosure DE 40 41 579.1 and corresponding U.S. Ser. No. 07/800,491, METTNER, filed Nov. 29, 1991; now U.S. Pat. No. 5,178,190

German Patent Disclosure DE 40 41 582.1 and corresponding U.S. Ser. No. 07/800,976, ROTHLEY, WOLF & ZABLER, filed Dec. 2, 1991;

German application P 41 06 288.4, BANTIEN, filed 28 Feb. 1991, and corresponding U.S. Ser. No. 07/825,945, filed Jan. 27, 1992

German application P 41 07 661.3, TRAH, filed 9 Mar. 1991, and corresponding U.S. Ser. No. 07/823,567, filed Feb. 10, 1992.

Cross-reference to other related patents

U.S. Pat. No. 4,581,624, O'CONNER/ALLIED, 8 Apr. 1986, entitled MICROMINIATURE SEMICONDUCTOR VALVE;

U.S. Pat. No. 4,836,023, OIKAWA/YAZAKI CORP., 6 Jun. 1989, entitled VIBRATIONAL ANGULAR RATE SENSOR;

U.S. Pat. No. 4,951,510, HOLM-KENNEDY et al., 28 Aug. 1990, entitled MULTIDIMENSIONAL FORCE SENSOR;

U.S. Pat. Nos. 4,549,926 and 4,578,142, CORBOY JR. et al/RCA;

U.S. Pat. No. 4,585,513, GALE et al/RCA, issued 29 Apr. 1986;

U.S. Pat. No. 4,658,495, FLATLEY & IPRI/RCA, issued 21 Apr. 1987;

U.S. Pat. No. 4,698,132, DENNIS/RCA, issued 6 Oct. 1987;

German Patent DE-PS 36 25 411, SEIDEL, 11 Nov. 1988, assigned to Messerschmidt-Bölkow-Blohm GmbH.

Cross-reference to related literature

Walter Kern, "Chemical Etching of Silicon, Germanium, Gallium Arsenide, and Gallium Phosphide", RCA REVIEW, June 1978, Vol. 39, pp. 278–308.

W. C. Tang et al., "Laterally Driven Polysilicon Resonant Microstructures", Vol. 20, Sensors & Actuators, pages 53–59, IEEE 1989.

FIELD OF THE INVENTION

The invention is based on a method for assembling micromechanical sensors, in particular Hall sensors, pressure sensors or acceleration sensors, in which at least one silicon sensor element is applied to a substrate.

BACKGROUND

The book entitled "Mikromechanik" [Micromechanics] by Anton Heuberger, [Publ.] Springer Verlag A.G. 1989, pp. 475–476, for example, describes the assembly of micromechanical sensor elements for pressure sensors and acceleration sensors. The sensor element is bonded to an intermediate substrate or silicon chip carrier of silicon or glass by anodic bonding and applied to a pedestal via the intermediate substrate. With the technique of anodic bonding, a reliable bond between the sensor element and the intermediate substrate is produced.

With the layout described here, however, a bond between the sensor element and the intermediate substrate is produced over the entire surface area. Assembly-dictated strains often occur in that case. These assembly-dictated strains and the associated temperature variations must be compensated for by individual adaptation of the evaluation circuit of each sensor.

In addition to anodic bonding, it is also known to glue the sensor element to a substrate, or to form the sensor element and evaluation circuit as a hybrid.

THE INVENTION

Briefly, in the method of the invention, at least one silicon sensor element is bonded to the substrate via at least one assembly pedestal, the bearing surfaces of which are small compared with the surface area of the silicon sensor element, so that a gap exists between the substrate and the silicon sensor element, except in the region of the at least one assembly pedestal.

This method has the advantage that the bonding area between the silicon sensor element and the substrate is minimized by the formation of assembly pedestals, and this reduces the assembly-dictated strains and the associated variations in temperature of the structure. This also simplifies the evaluation electronics of the sensor.

Other provisions of the method of the invention are also advantageous. Forming the assembly pedestals by structuring the underside of the silicon sensor element is especially advantageous, because micromechanical structuring processes such as isotropic or anisotropic silicon etching, can be used for this purpose. These processes are adequately well known and are very easy to handle.

It is also advantageous to structure the assembly pedestals already in the course of structuring the micromechanical functional elements of the sensor element; this can be done easily, because both structures are produced by the same process.

One special advantage of the method according to the invention is that the bonding between the silicon sensor element and the substrate takes place at the wafer level and thus economically in batch processing. In other words, a plurality of ready-structured sensor elements, which have not yet been cut into individual sensors, are applied jointly to a substrate and then separated, for instance by sawing, only after the silicon sensor elements have been bonded to the substrate. The spacing that results between the silicon sensor element and the substrate because of the height of the assembly pedestals is selected such that the sludge produced in sawing the wafer can be flushed out.

Other advantageous options for forming assembly pedestals are to form the assembly pedestals by structuring recesses out of the top of the substrate, or in the case of a silicon substrate to apply a glass wafer to the underside of the silicon sensor element or to the top of the substrate, for example by anodic bonding, and then to remove this glass wafer, for instance by back-polishing and etching, except for the assembly pedestal. An advantageous bonding technique will be selected depending on the substrate material. If silicon substrates are used, then the bonding of the sensor element to the substrate is advantageously done by silicon-to-silicon bonding; if glass substrates are used, then anodic bonding is advantageous. In both cases, these are standard methods in micromechanics. For other substrate materials, bonding techniques such as adhesive bonding or soldering are advantageously employed.

If a silicon substrate is used and the assembly pedestals are structured by recessing out of either the silicon sensor element or the substrate, then it is advantageous for a film of glass to be applied to the assembly pedestal, for example by vapor deposition, or sputtering, which film can then be structured, and by way of which the bond between the silicon sensor element and the substrate can then be produced by anodic bonding.

A particular advantage of the method according to the invention is that the manner of assembly, or in other words the number of bearing points, of the sensor element can be selected in accordance with the function of the sensor. Bearing by way of three assembly pedestals arranged in a triangle is advantageous, because these three assembly pedestals define a unique bearing plane. This is important particularly for Hall sensors. Assembling the sensor element via an assembly pedestal, resulting in a mushroom-like construction of the sensor element on the assembly pedestal, is also suitable for Hall sensors. Alternatively, however, the sensor element can be secured on one side via only a single assembly pedestal; this is especially advantageous for capacitive acceleration sensors.

The method according to the invention makes a particularly compact kind of sensor structure possible, in which the evaluation circuit and any possible compensation of the sensor element are integrated on the substrate. With this type of construction, the only areas that need to be kept free on the substrate in the region of the assembly pedestals are those without any integrated circuit elements.

DRAWINGS

DETAILED DESCRIPTION

Figure 1A:
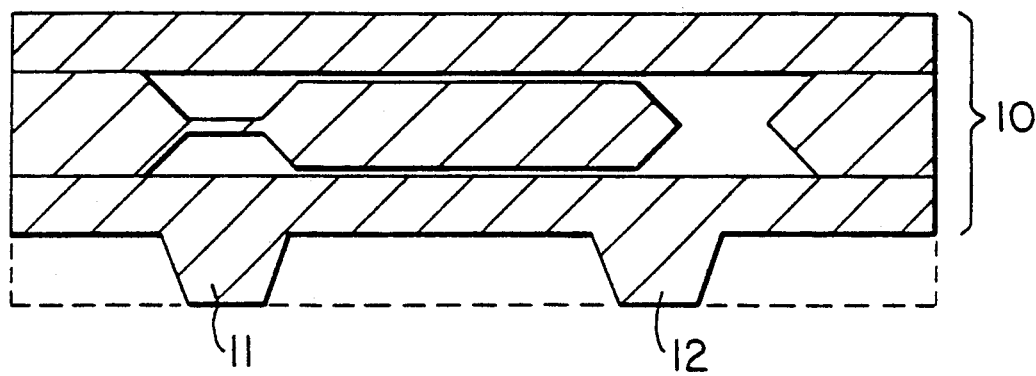
FIG. 1a is a section taken through a sensor element having assembly pedestals.

The exemplary embodiments described hereinafter are based on reducing the bearing surface of a sensor element on a substrate to three or fewer points, embodied by assembly pedestals. In FIG. 1, reference numeral 10 designates a silicon sensor element, which is schematically shown as an acceleration sensor but which may have any arbitrary micromechanical structure depending on its function. From one surface of the sensor element 10, in this case the underside, assembly pedestals 11, 12 and 13 have been structured out. In FIG. 1a, the original underside of the sensor element 10 is shown in dashed lines. The assembly pedestals 11, 12 and 13 here are produced by anisotropic etching away of the surface except for three islets; depending on the crystal orientation of the silicon sensor element 10 and the anisotropic properties of the etching solution used, the assembly pedestals 11, 12 and 13 are pyramidal in shape.

Figure 1B:
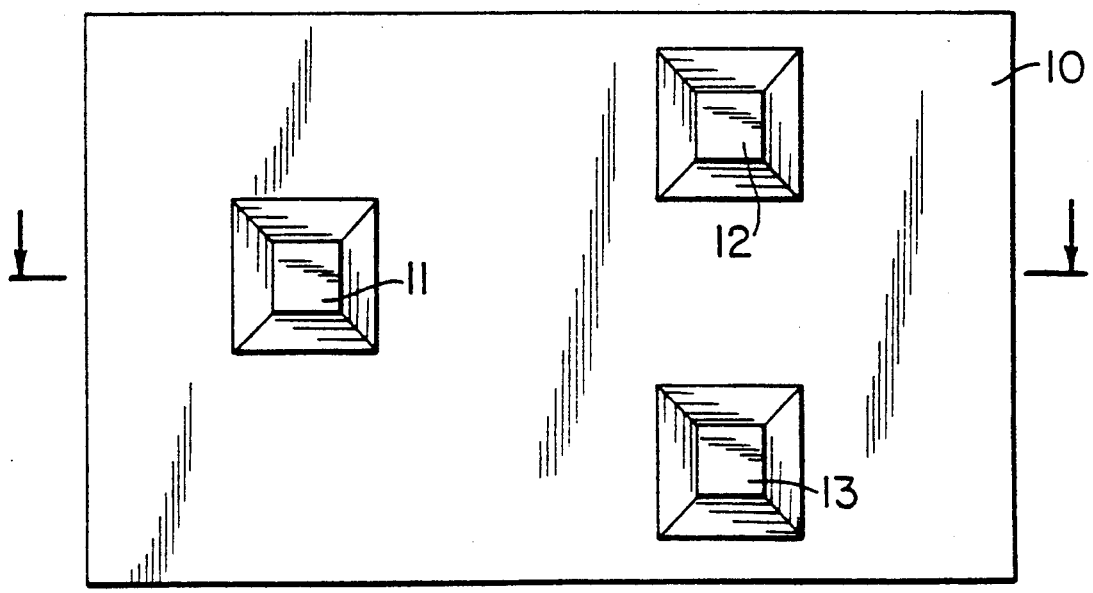
FIG. 1b is a top view on the sensor element surface provided with assembly pedestals.

With a suitable design of the etching mask, an isotropic etching process can also be used for this purpose. In FIG. 1b, the top view on the surface of the sensor element 10 provided with assembly pedestals is shown. Here, the assembly pedestals 11, 12, 13 are disposed as the corner points of a triangle, so that the bearing plane of the sensor element and thus the spacing between the spacer element 10 and a substrate are defined by the height of the assembly pedestals 11, 12, 13.

Figure 2A:
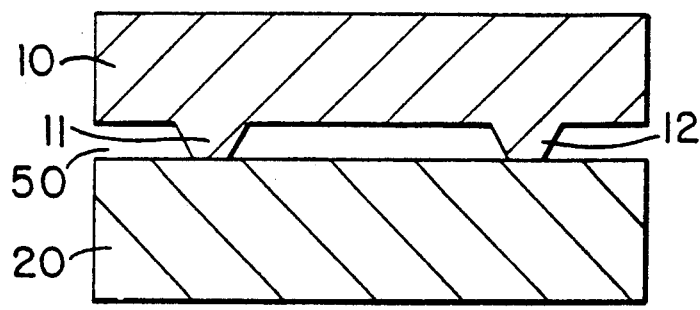
FIGS. 2a-d, 3a-d, 4, 5a and b and 6 show various assembly options for a sensor element, with various design possibilities for the assembly pedestals.
Figure 2B:
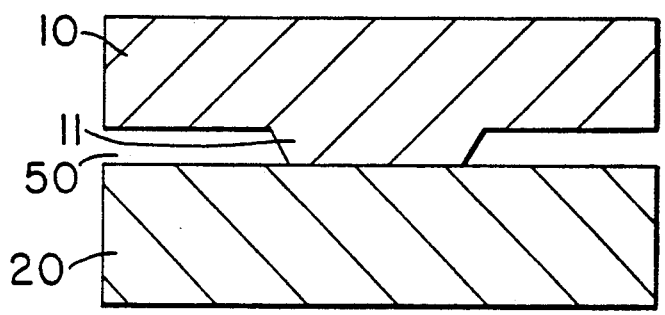
Figure 2C:
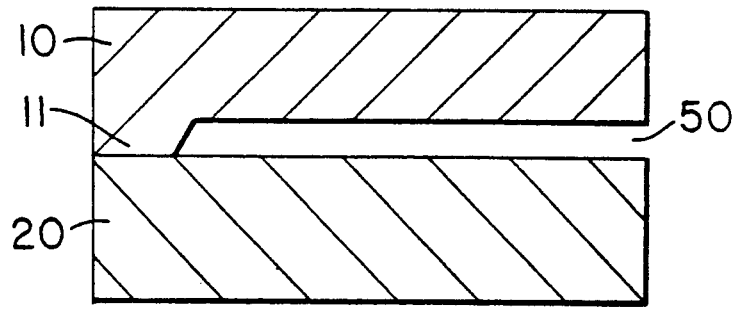
Figure 2D:
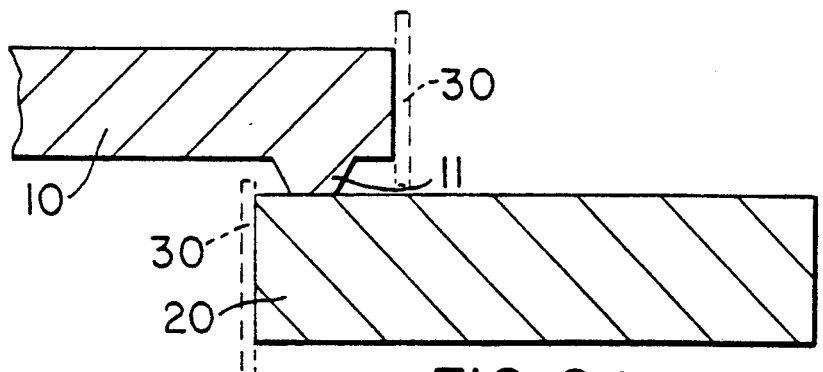
Figure 3A:
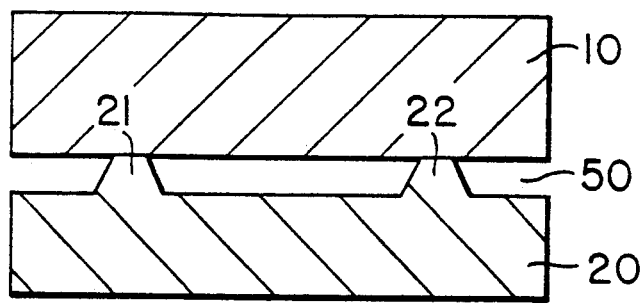
Figure 3B:
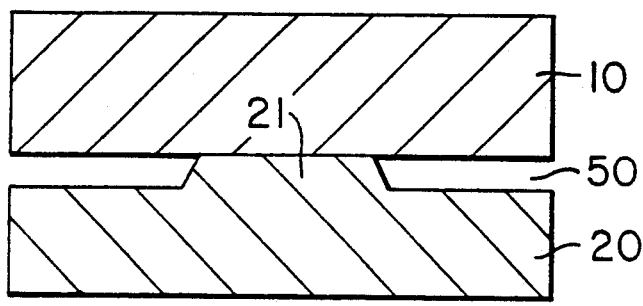
Figure 3C:
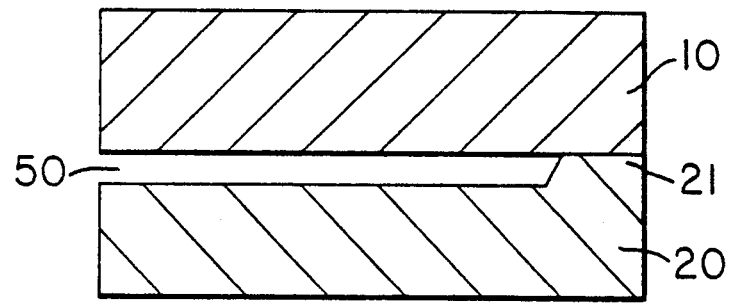
Figure 3D:
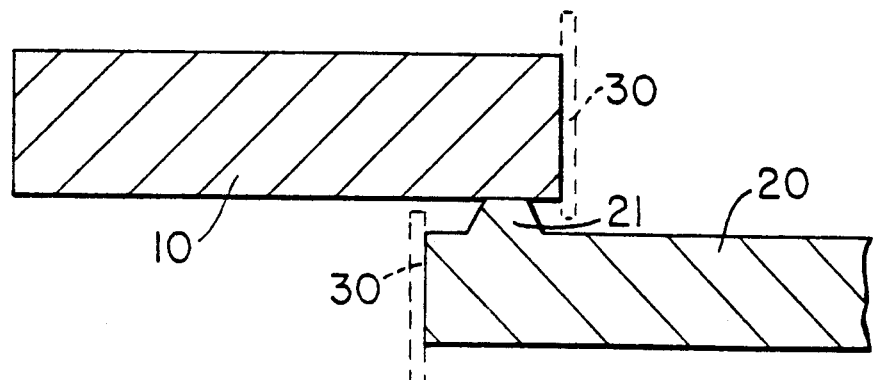

FIGS. 2a-d show various design and disposition options for assembly pedestals in a sensor element and substrate structure. In these exemplary embodiments, assembly pedestals 11, 12 are each structured out of the underside of the schematically shown sensor element 10; the substrate 20 is not structured. FIG. 2a shows a two-point and a three-point bearing, in section, corresponding to FIGS. 1a and b. With this form of assembly, the sensor element 10 is fixed in one plane. By means of the gap 50 that is produced between the sensor element 10 and the substrate 20, the assembly-dictated strain of this design is kept quite low. FIG. 2b shows a mushroom-like design, in which the sensor element 10 is bonded to the substrate 20 via only one assembly pedestal 11. The types of assembly shown in FIGS. 2a and 2b are especially suitable for Hall sensors. In FIGS. 2c and 2d, the sensor elements 10 are again bonded to the substrate 20 via only one assembly pedestal 11. The design is asymmetrical here, however; that is, the sensor element 10 is bonded to the substrate 20 on one side. This type of assembly is especially suitable for acceleration sensors. FIG. 2c shows a design in which the substrate 20 and the sensor element 10 are disposed in centered fashion one above the other. In contrast to this, in the design shown in FIG. 2d, the substrate 20 and the sensor element 10 are offset with respect to one another.

In FIGS. 3a-d, sensor element and substrate designs are shown in analogy with the exemplary embodiments shown in FIGS. 2a-d. However, in these embodiments assembly pedestals 21, 22 are each structured out of the top of the substrate 20, and the schematically shown sensor element 10 is not structured. The substrate 20 can for instance be formed by a silicon wafer or a glass wafer; other materials are also suitable, however, depending on the demands made of the sensor. Structuring of a silicon or glass substrate, like that of the silicon sensor element, can be done by micromechanical structuring processes such as isotropic or anisotropic etching. As a bonding technique, silicon-to-silicon bonding is suitable in the case of a silicon substrate, while anodic bonding is suitable in the case of a glass substrate; with substrates of other materials, the bonding can for instance be produced by adhesive bonding or soldering.

With the assembly of sensor elements on substrates according to the invention, it is possible for a plurality of sensor elements to be bonded to one substrate and for separation of the sensor elements bonded to the substrate to be performed only thereafter. This is typically done by sawing. In the assembly variants shown in FIGS. 2a-c and 3a-c, the sensor elements were separated at the same point as the substrate. The width of the gap 50, which is determined via the height of the assembly pedestals 11, 12, 21, 22, is selected such that the sludge created in the sawing can be flushed out. In the variants shown in FIGS. 2d and 3d, the saw cuts that cut apart the sensor elements and cut through the substrate are offset from one another. In this variant, it is particularly easy to remove the sawing sludge.

Figure 4:
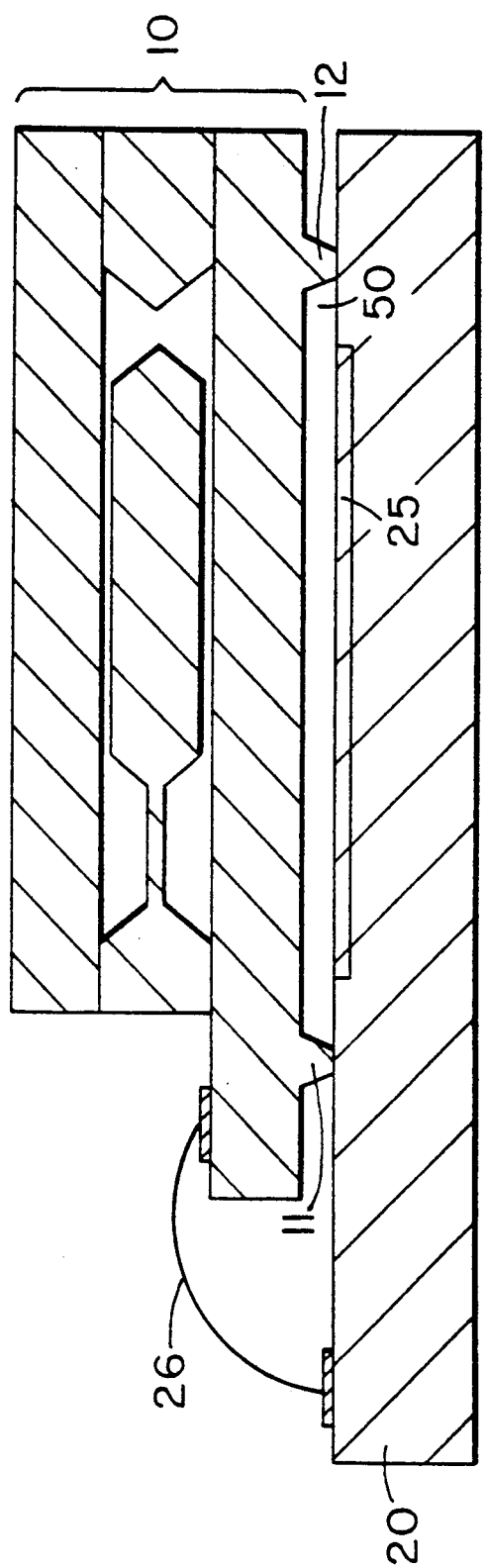
Figure 5A:
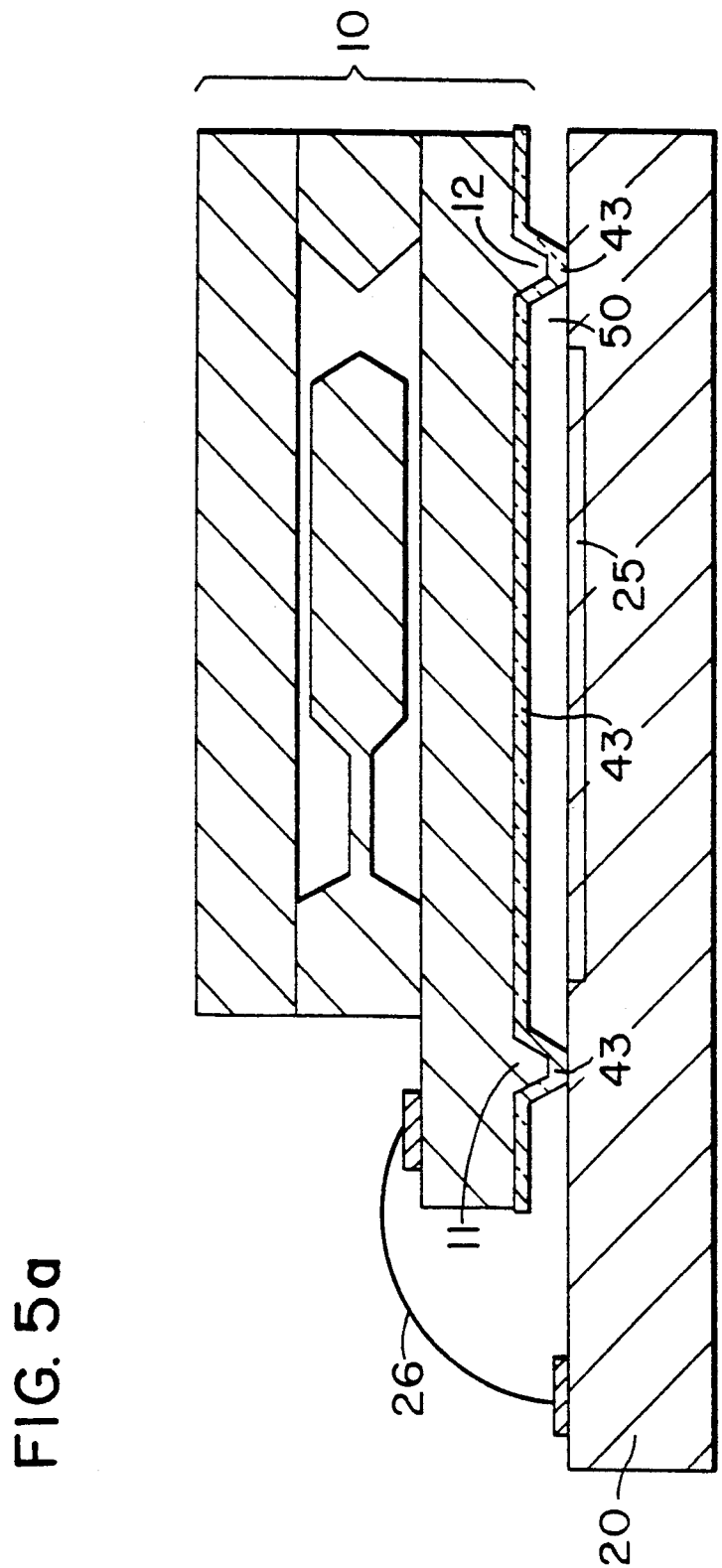

In FIGS. 4, 5a and b and 6, further options according to the invention for assembling an acceleration sensor element 10 on a substrate 20 are shown. In these examples, the substrate 20 is a silicon chip, on which parts of the evaluation circuit 25 are integrated with a calibration means for the sensor element 10. The regions of the surface of the chip 20 that are connected to the assembly pedestals are recessed out, however; that is, no circuit elements are integrated there. The electrical bonding 26 of the sensor element 10 to the parts of the evaluation circuit 25 integrated on the chip 20 is shown here schematically by a bonding wire that connects bonding pads.

In FIG. 4, assembly pedestals 11, 12 are structured out of the underside of the sensor element 10. At least one of the assembly pedestals 11 is firmly bonded to the chip 20 by silicon-to-silicon bonding; the other assembly pedestal 12 can either also be firmly bonded to the chip 20 or rest loosely on the chip 20, which further reduces the assembly-dictated strains.

Figure 5B:
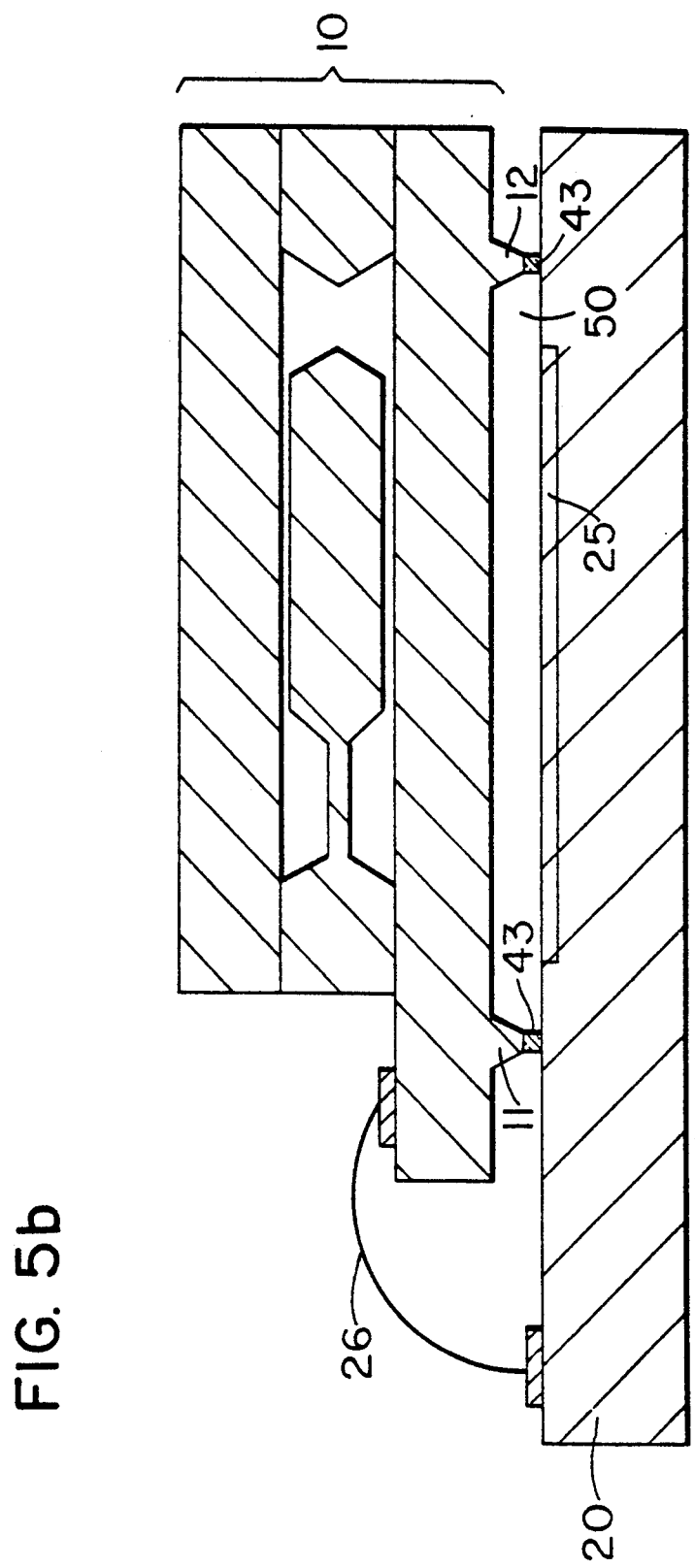

FIGS. 5a and b show exemplary embodiments in which the bonding between the sensor element 10 and chip 20 is done by anodic bonding. The assembly pedestals 11, 12, as in the variant of FIG. 4, are structured out of the underside of the sensor element 10. A glass film 43 is deposited thereon. It may for instance be vapor-deposited or sputtered. The glass film 43 of the exemplary embodiment in FIG. 5a is not structured in contrast to the example shown in FIG. 5b. Here, the glass film 43 was removed again, except in the region of the bearing faces of the assembly pedestals. As in the exemplary embodiment shown in FIG. 4, the sensor elements 10 are each bonded firmly to the chip 20 via at least one assembly pedestal 11 and merely rest on a further assembly pedestal 12, so that the assembly-dictated strains are reduced further.

Figure 6:
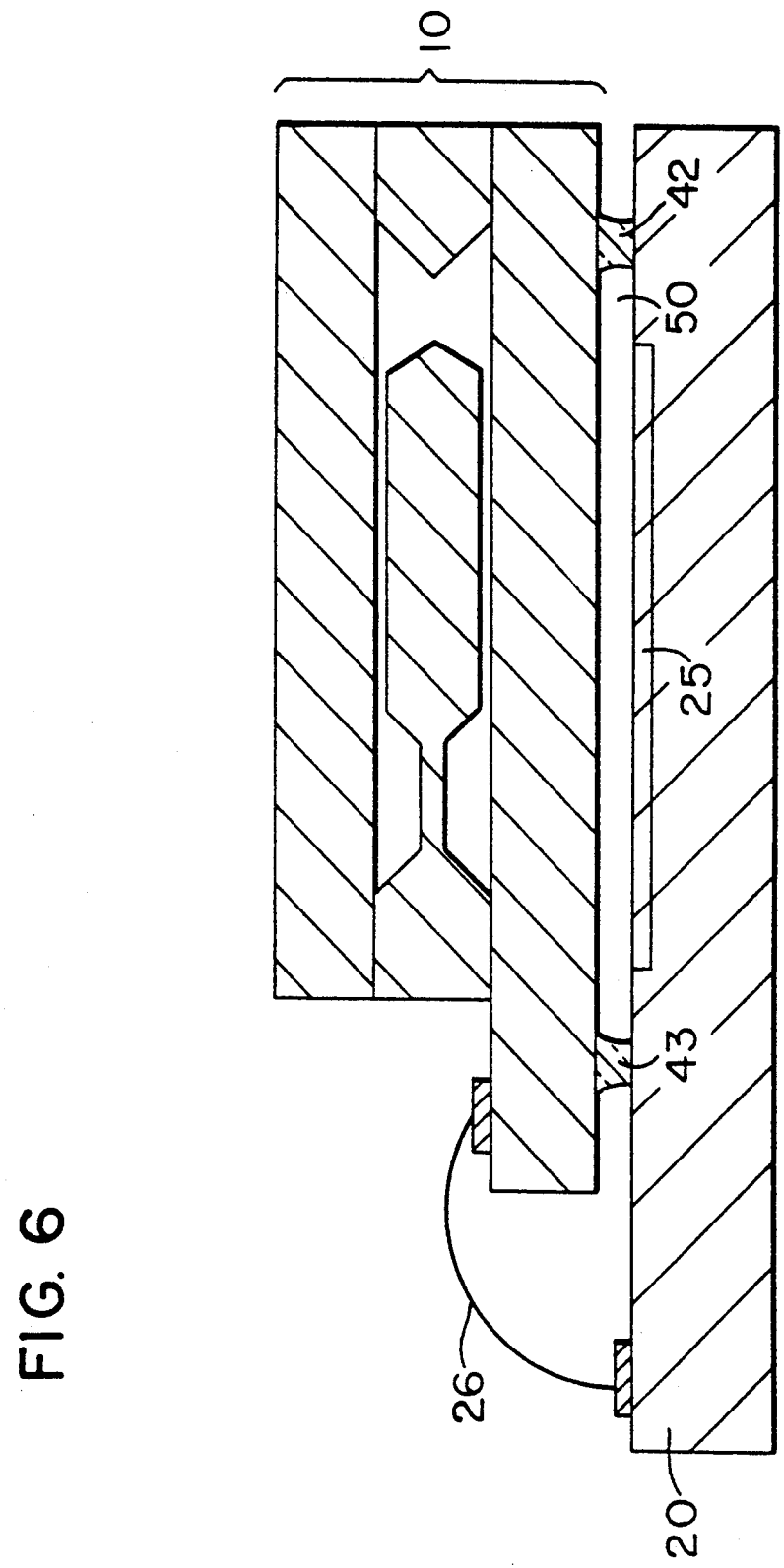

In the exemplary embodiment shown in FIG. 6, the assembly pedestals 41, 42 are made of glass. To this end, a glass wafer is applied, for instance by anodic bonding, to the surface of the sensor element 10 to be joined to the chip 20; this glass wafer is then removed again by back-polishing and etching, except for the regions of the assembly pedestals 41, 42. The bonding with the chip 20 can then again be done by anodic bonding. In the event that the substrate 20 is formed by a passive silicon wafer, that is, a silicon wafer without integrated circuit elements and the surface oriented toward the silicon sensor element, then the bonding between the silicon sensor element and the substrate can be done, analogously to the exemplary embodiments shown in FIGS. 4, 5a and b and 6, also via a structured or unstructured glass film applied to the substrate 20, or via a structured glass wafer bonded against the substrate 20.

Various charges and modifications may be made, and features described in connection with any one of the embodiments may be used with any of the others, within the scope of the inventive concept.

What is claimed is:

1. A method for assembling micromechanical sensors, particularly Hall sensors, pressure or acceleration sensors, in which at least one silicon sensor element is applied to a substrate, characterized in that the at least one silicon sensor element (10) is bonded to the substrate (20) via at least one assembly pedestal (11, 12, 13), the bearing faces of which are small compared with the surface area of the silicon sensor element (10), so that a gap (50) exists between the substrate (20) and the silicon sensor element (10), except in the region of the at least one assembly pedestal (11, 12, 13), thereby minimizing temperature-induced tensions between the sensor element (10) and the substrate (20).

2. The method of claim 1, characterized in that the at least one assembly pedestal (11, 12, 13) is structured, by isotropic or anisotropic etching, out of the surface, to be joined to the substrate (20), of the silicon sensor element (10).

3. The method of claim 1, characterized in that the at least one assembly pedestal (21, 22) is structured out of the surface, to be bonded to the silicon sensor element (10), of the substrate (20).

4. The method of claim 1, characterized in that the substrate (20) is a silicon wafer, and the bond between the silicon sensor element (10) and the substrate (20) is produced by direct silicon-to-silicon bonding.

5. The method of claim 1, characterized in that the substrate (20) is a glass body, and the bond between the silicon sensor element (10) and the substrate (20) is made by anodic bonding.

6. The method of claim 1, characterized in that the bond between the silicon sensor element (10) and the substrate (20) is made by adhesive bonding or soldering.

7. The method of claim 1, characterized in that the substrate (20) is a silicon wafer, and that a glass film (43) is applied, preferably by vapor deposition or sputtering, to the surface, to be joined to the substrate (20), of the silicon sensor element (10), or to the surface, to be joined to the silicon sensor element (10), of the substrate (20).

8. The method of claim 7, characterized in that
the glass film (43) is structured in such a manner that the glass film (43) is maintained, at least in the region of the bearing faces of the assembly pedestals.

9. The method of claim 1,
characterized in that
a glass wafer is applied to the surface, to be bonded to the substrate (20), of the silicon sensor element (10) or to the surface, to be bonded to the silicon sensor element (10), of the substrate (20), and that the glass wafer is preferably removed again by back-polishing and etching, except for at least one region that forms the at least one assembly pedestal (41, 42).

10. The method of claim 7,
characterized in that
the bond between the silicon sensor element (10) and the substrate (20) is made by anodic bonding.

11. The method of claim 1,
characterized in that
a plurality of silicon sensor elements (10) are applied to one substrate (20), and not until after the bonding of the silicon sensor elements (10) to the substrate (20) are they separated, preferably by sawing out the silicon sensor elements (10) and sawing through the substrate (20).

* * * * *